(12) United States Patent
Wang (10) Patent No.: US 8,928,307 B2
(45) Date of Patent: Jan. 6, 2015

(54) SIGNAL DETECTION CIRCUIT, METHOD AND SYSTEM

(75) Inventor: Zhengxiang Wang, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 553 days.

(21) Appl. No.: 13/250,736

(22) Filed: Sep. 30, 2011

(65) Prior Publication Data

US 2012/0081103 A1     Apr. 5, 2012

(30) Foreign Application Priority Data

Sep. 30, 2010 (CN) .......................... 2010 1 0506141

(51) Int. Cl.
*G01R 19/00*       (2006.01)
*G01R 19/165*     (2006.01)

(52) U.S. Cl.
CPC .... G01R 19/16566 (2013.01); *G01R 19/16519* (2013.01)
USPC ....................................................... 324/76.11

(58) Field of Classification Search
CPC ................... G01R 19/16566; G01R 19/16571; G01R 19/1659; G01R 19/165; G01R 19/16519
See application file for complete search history.

(56) References Cited

U.S. PATENT DOCUMENTS

| | | | | |
|---|---|---|---|---|
| 4,717,839 | A | * | 1/1988 | Miller .............................. 327/73 |
| 4,868,417 | A | * | 9/1989 | Jandu .............................. 327/65 |
| 6,169,475 | B1 | | 1/2001 | Browning |
| 7,119,701 | B2 | | 10/2006 | Browning |
| 2004/0066845 | A1 | | 4/2004 | Leith et al. |
| 2007/0100609 | A1 | | 5/2007 | Kim |

FOREIGN PATENT DOCUMENTS

| | | |
|---|---|---|
| CN | 1956055 A | 5/2007 |
| CN | 101441230 A | 5/2009 |

OTHER PUBLICATIONS

Partial translation of Office Action dated Mar. 6, 2012 in connection with Chinese Patent Application No. 201010506141.2, (7 pages).
Partial translation of Office Action dated Aug. 22, 2012 in connection with Chinese Patent Application No. 201010506141.2, (6 pages).

* cited by examiner

*Primary Examiner* — Paresh Patel
(74) *Attorney, Agent, or Firm* — Huawei Technologies Co., Ltd.

(57) ABSTRACT

A signal detection circuit is provided, and includes a signal conversion module, a threshold control module, and a comparison module. The signal conversion module is configured to: convert a reference voltage signal into a reference current signal, and send the reference current signal to the threshold control module; convert a voltage signal to be detected into a current signal to be detected, and send the current signal to be detected to the comparison module. The threshold control module is configured to: generate a threshold current signal according the reference current signal, and send the threshold current signal to the comparison module; and receive a threshold control signal, and change magnitude of the threshold current signal according to the threshold control signal. The comparison module is configured to compare magnitude of the current signal to be detected with the magnitude of the threshold current signal, and output a comparison result.

8 Claims, 7 Drawing Sheets

| D1 | D0 | Multiple |
|----|----|----------|
| 0 | 0 | 1 |
| 0 | 1 | 2 |
| 1 | 0 | 3 |
| 1 | 1 | 4 |

SIGNAL DETECTION CIRCUIT, METHOD AND SYSTEM

CROSS-REFERENCE TO RELATED APPLICATIONS

This application claims priority to Chinese Patent Application No. 201010506141.2, filed on Sep. 30, 2010, which is hereby incorporated by reference in its entirety.

FIELD OF THE INVENTION

The present invention relates to the field of communications technologies, and in particular, to a circuit, a method, and a system for signal detection.

BACKGROUND OF THE INVENTION

Currently, Local Area Networks (hereinafter referred to as LANs) are generally based on the 10BASE-T, 100BASE-T, and 1000BASE-T protocols, and receive and send signals by using twisted-pair cables. When a Physical Layer Device (hereinafter referred to as PHY) of a sender communicates with a PHY of a receiver, the sender and the receiver both need to send a 10 Mbps link signal or a 100 Mbps signal (hereinafter referred to as a negotiation signal) to the other party. The negotiation signal is used to notify the other party of communication capability of the sender or the receiver, for example, a speed mode and a duplex mode. If a remote PHY is powered off or a twisted-pair cable is disconnected so that a failure that a local PHY cannot receive the negotiation signal occurs, the local PHY may go into a low power consumption mode, and most of signal processing circuits are turned off to save power consumption, which is especially important for an electronic device powered by a battery. If the failure is recovered, that is, when the local PHY can receive the negotiation signal, the local PHY needs to be wakened to enter a normal working mode, and start an auto-negotiation process. Therefore, in order to save the power consumption without influencing normal work, the PHY requires a signal detection circuit to monitor an energy status (for example, a signal amplitude) on the twisted-pair cable for indicating whether the negotiation signal occurs.

In the prior art, a signal detection circuit is generally implemented by adopting separate devices, so that the cost for setting up a whole signal detection circuit is high. Furthermore, a single threshold of a comparator adopted by the conventional signal detection circuit is set, and therefore, detection flexibility of the whole signal detection circuit is poor.

SUMMARY OF THE INVENTION

In order to solve the preceding problem, embodiments of the present invention provide a circuit, a method, and a system for signal detection.

In one aspect, a signal detection circuit provided by an embodiment of the present invention includes a signal conversion module, a threshold control module, and a comparison module, where:

the signal conversion module is configured to: convert a reference voltage signal into a reference current signal, and send the reference current signal to the threshold control module; and convert a voltage signal to be detected into a current signal to be detected, and send the current signal to be detected to the comparison module;

the threshold control module is configured to: generate, according to the reference current signal, a threshold current signal having a first proportional relation with the reference current signal, and send the threshold current signal to the comparison module; and receive a threshold control signal, and change magnitude of the threshold current signal according to the threshold control signal; and the comparison module is configured to compare magnitude of the current signal to be detected with the magnitude of the threshold current signal, and output a comparison result.

In another aspect, a signal detection method provided by an embodiment of the present invention includes:

converting a reference voltage signal into a reference current signal, and sending the reference current signal to a threshold control module; and converting a voltage signal to be detected into a current signal to be detected, and sending the current signal to be detected to a comparison module;

generating, according to the reference current signal, a threshold current signal having a first proportional relation with the reference current signal, and sending the threshold current signal to the comparison module; and receiving a threshold control signal, and changing magnitude of the threshold current signal according to the threshold control signal; and comparing magnitude of the current signal to be detected with the magnitude of the threshold current signal, and outputting a comparison result.

In another aspect, a signal detection system provided by an embodiment of the present invention includes the signal detection circuit as described in the preceding.

In the circuit, the method, and the system for signal detection provided in the embodiments of the present invention, through this embodiment of the present invention, the signal conversion module converts the reference voltage signal into the reference current signal and converts the voltage signal to be detected into the current signal to be detected; the threshold control module may receive the threshold control signal, changes the magnitude of the threshold current signal according to the threshold control signal, and sends the threshold current signal to the comparison module. In this way, the threshold of the signal detection circuit may be configured flexibly, so that detection flexibility of the signal detection circuit is improved. Furthermore, in the embodiments of the present invention, the signal detection circuit is integrated into a PHY chip through an integrated circuit technology, so that the setting-up cost is reduced in comparison with the prior art.

DETAILED DESCRIPTION OF THE EMBODIMENTS

A signal detection circuit provided in the present invention is described in detail in the following with reference to specific embodiments and accompanying drawings.

Figure 1:
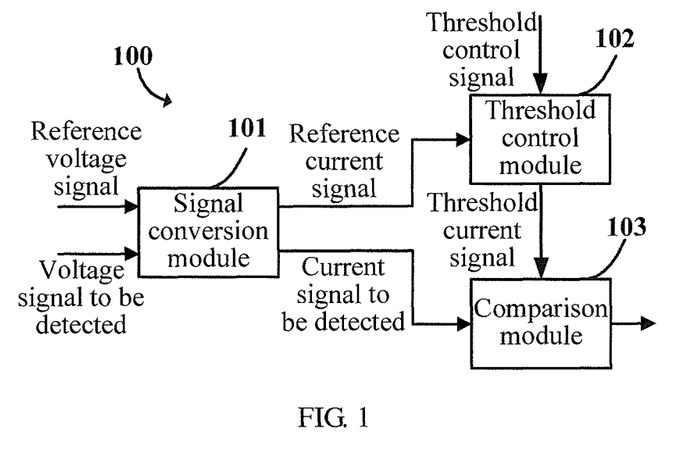
FIG. 1 is a schematic structural diagram of a signal detection circuit according to an embodiment of the present invention.

As shown in FIG. 1, a signal detection circuit 100 is provided in an embodiment of the present invention. The circuit includes a signal conversion module 101, a threshold control module 102, and a comparison module 103.

The signal conversion module 101 is configured to: convert a reference voltage signal into a reference current signal, and send the reference current signal to the threshold control module; and convert a voltage signal to be detected into a current signal to be detected, and send the current signal to be detected to the comparison module.

The threshold control module 102 is configured to: generate a threshold current signal according the reference current signal, and send the threshold current signal to the comparison module; and receive a threshold control signal that is input according to detection requirements, and change magnitude of the threshold current signal according to the threshold control signal.

Optionally, the threshold control signal is a digital threshold control signal. The threshold control module is specifically configured to: generate, according to the reference current signal, a threshold current signal having a first proportional relation with the reference current signal; and receive the digital threshold control signal, and adjust the first proportional relation between the threshold current signal and the reference current signal according to the digital threshold control signal, so as to change the magnitude of the threshold current signal.

The comparison module 103 is configured to compare magnitude of the current signal to be detected with the magnitude of the threshold current signal, and output a comparison result.

The magnitude of the threshold current signal is changed according to the threshold control signal, so that a threshold of the signal detection circuit may be configured flexibly, thus improving detection flexibility of the signal detection circuit. In addition, in this embodiment of the present invention, the signal detection circuit may be integrated into a PHY chip through an integrated circuit technology, so that the setting-up cost is reduced.

Figure 2:
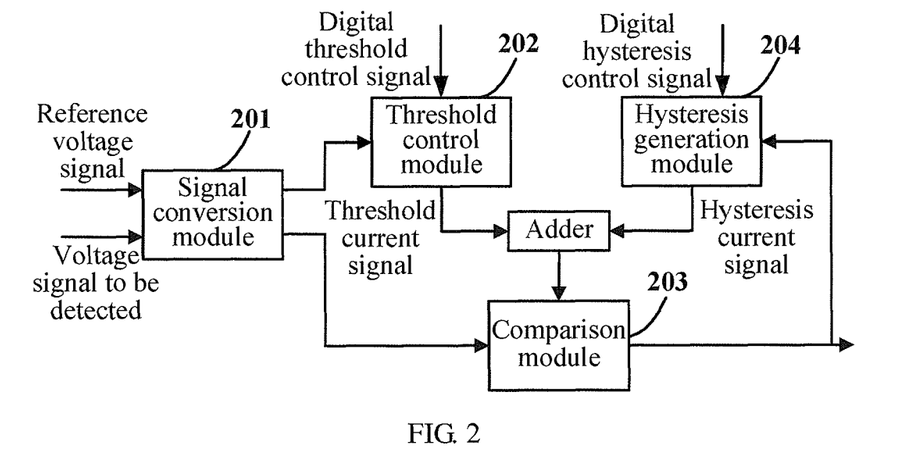
FIG. 2 is a schematic structural diagram of another signal detection circuit according to an embodiment of the present invention.

As shown in FIG. 2, another signal detection circuit is provided in an embodiment of the present invention. The circuit includes a signal conversion module 201, a threshold control module 202, a comparison module 203, and a hysteresis generation module 204.

The signal conversion module 201 is configured to: convert a reference voltage signal into a reference current signal, and send the reference current signal to the threshold control module; and convert a voltage signal to be detected into a current signal to be detected, and send the current signal to be detected to the comparison module.

The threshold control module 202 is configured to: generate, according to the reference current signal, a threshold current signal having a first proportional relation with the reference current signal, and send the threshold current signal to the comparison module; and receive a threshold control signal that is input according to detection requirements, and change magnitude of the threshold current signal according to the threshold control signal. Optionally, the threshold control signal is a digital threshold control signal. The threshold control module 202 is further configured to receive the digital threshold control signal, and adjust the first proportional relation between the threshold current signal and the reference current signal according to the digital threshold control signal, so as to change the magnitude of the threshold current signal. Optionally, the threshold control signal that is input according to the detection requirements may be set according to different application scenarios. If a different threshold current signal to be detected needs to be detected, a different threshold control signal is set, and the first proportional relation is adjusted according to the threshold control signal so as to change the magnitude of the threshold current signal.

The comparison module 203 is configured to compare magnitude of the current signal to be detected with the magnitude of the threshold current signal, and output a comparison result.

The hysteresis generation module 204 is configured to: generate, according to the reference current signal, a hysteresis current signal having a second proportional relation with the reference current signal; receive the comparison result output by the comparison module; according to the comparison result, determine whether to superimpose the hysteresis current signal onto the threshold current signal; and receive a digital hysteresis control signal, and adjust the second proportional relation according to the digital hysteresis control signal, so as to change magnitude of the hysteresis current signal.

When the comparison result is a high level, the hysteresis current signal is superimposed onto the threshold current signal. When the comparison result is a low level, the hysteresis current signal is not superimposed onto the threshold current signal. The not superimposing the hysteresis current signal onto the threshold current signal may be understood as follows: The hysteresis current signal is generated, but the hysteresis current signal is not superimposed onto the threshold current signal, or the hysteresis current signal is generated, but the hysteresis current signal superimposed onto the threshold current signal is 0, or the hysteresis current signal is not generated.

In this embodiment of the present invention, the hysteresis current signal is selectively superimposed onto the threshold current signal, so that when magnitude of the voltage signal to be detected becomes greater or becomes smaller, two corresponding thresholds of the signal detection circuit may be generated, in this way, hysteresis is introduced and noise suppression capability of the signal detection circuit is enhanced.

Figure 3:
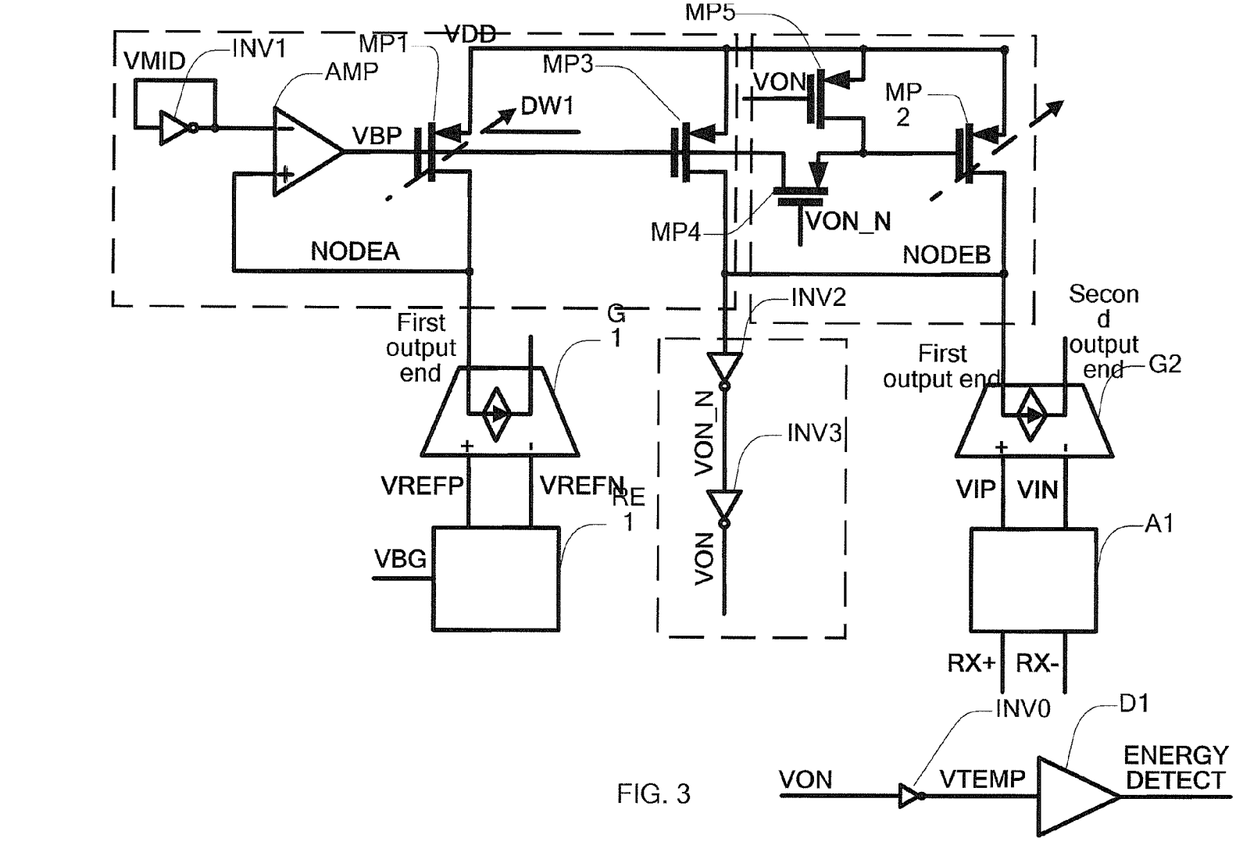
FIG. 3 is a diagram of a signal detection circuit according to an embodiment of the present invention.

Based on the preceding embodiment, as shown in FIG. 3, a single-end signal detection circuit is provided in an embodiment of the present invention.

A signal conversion module includes a first signal conversion module G1 and a second signal conversion module G2.

The first signal conversion module is configured to convert a reference voltage signal into a reference current signal. The second signal conversion module is configured to convert a voltage signal to be detected into a current signal to be detected. The first signal conversion module and the second signal conversion module have the same voltage-current conversion gain. For a specific voltage-current conversion circuit module, reference may be made to FIG. 5.

A threshold control module includes: a first inverter INV1, an operational amplifier AMP, a first Metal-Oxide Semiconductor (MOS) Field Effect Transistor (FET) MP1, and a third MOS FET MP3. The first MOS BET MP1 is a programmable MOS FET, and for a specific circuit structure, reference may be made to FIG. 6.

A comparison module includes a second inverter INV2 and a third inverter INV3.

A hysteresis generation module includes: a second MOS FET MP2, a fourth MOS FET MP4, and a fifth MOS FET MP5. The second MOS FET MP2 is a programmable MOS FET, and for a specific circuit structure, reference may also be made to FIG. 6.

An output end of the first inverter INV1 is connected with an input end of the first inverter INV1, and the output end of the first inverter INV1 is connected with a negative phase input end of the operational amplifier AMP.

A positive phase input end of the operational amplifier AMP is connected with a drain electrode of the first MOS FET MP1 and a first output end of the first signal conversion module G1.

An output end of the operational amplifier AMP is connected with a grid electrode of the first MOS FET MP1 and a grid electrode of the third MOS FET MP3.

A source electrode of the first MOS FET MP1 and a source electrode of the third MOS BET MP3 are connected with a power source VDD.

A drain electrode of the third MOS FET MP3 is connected with an input end of the second inverter INV2 and a first output end of the second signal conversion module G2.

An output end of the second inverter INV2 is connected with an input end of the third inverter INV3.

An output end of the third inverter INV3 outputs a first comparison result VON and feeds back the VON to a grid electrode of the fifth MOS BET MP5 of the hysteresis generation module. The output end of the second inverter INV2 outputs a signal VON_N and feeds back the signal VON_N to a grid electrode of the fourth MOS FET MP4 of the hysteresis generation module.

A source electrode of the second MOS FET MP2 and a source electrode of the fifth MOS FET MP5 are connected with the power source VDD.

A grid electrode of the second MOS FET MP2 is connected with a source electrode of the fourth MOS FET MP4 and a drain electrode of the fifth MOS FET MP5.

A drain electrode of the second MOS FET MP2 is connected with the first output end of the second signal conversion module G2, the input end of the second inverter INV2, and the drain electrode of the third MOS FET MP3 respectively.

The grid electrode of the fifth MOS BET MP5 is connected with the output end of the third inverter INV3.

The grid electrode of the fourth MOS FET MP4 is connected with the output end of the second inverter INV2.

A drain electrode of the fourth MOS FET MP4 is connected with the grid electrode of the third MOS FET MP3.

In this embodiment of the present invention, all the MOS FETs are P-Type Metal-Oxide Semiconductor (PMOS) FETs, and all the MOS FETs may also be implemented through N-Type Metal-Oxide Semiconductor (NMOS) FETs in the same manner. Persons skilled in the art may easily replace all or a part of the circuits in this embodiment of the present invention according to the disclosure of this embodiment of the present invention. For example, the MOS FET may be replaced with other kinds of transistors; or the signal conversion module, the threshold control module, the comparison module, or the hysteresis generation module may be replaced with other similar circuits having the same functions.

In the embodiment shown in FIG. 3, when the current signal to be detected flowing out of an input end of the comparison module (the input end of INV2) has greater magnitude than the threshold current signal flowing into the input end of the comparison module, the comparison module outputs a low-level voltage; when the current signal to be detected flowing out of the input end of the comparison module has smaller magnitude than the threshold current signal flowing into the input end of the comparison module, the comparison module outputs a high-level voltage; and when both the current signal to be detected and the threshold current signal flow into the input end of the comparison module, the comparison module outputs a high-level voltage. It may be understood that, if the currents flow in opposite directions, when the current signal to be detected flowing into the input end (the input end of INV2) of the comparison module has greater magnitude than the threshold current signal flowing out of the input end of the comparison module, the comparison module outputs a high-level voltage; when the current signal to be detected flowing into the input end of the comparison module has smaller magnitude than the threshold current signal flowing out of the input end of the comparison module, the comparison module outputs a low-level voltage; and when both the current signal to be detected and the threshold current signal flow out of the input end of the comparison module, the comparison module outputs a low-level voltage.

Here, the hysteresis generation module is further configured to: when the comparison result output by an output end (the output end of INV3) of the comparison module is a high-level voltage, superimpose a hysteresis current signal onto the threshold current signal; and when the comparison result output by the comparison module is a low-level voltage, is configured not to superimpose the hysteresis current signal onto the threshold current signal.

Here, the second signal conversion module has a first input end, a second input end, a first output end, and a second output end. When a voltage of the first input end is greater than a voltage of the second input end, the current signal to be detected flows into the second signal conversion module from the first output end and flows out of the second signal conversion module from the second output end. When the voltage of the first input end is smaller than the voltage of the second input end, the current signal to be detected flows out of the second signal conversion module from the first output end and flows into the second signal conversion module from the second output end. A differential voltage signal to be detected input from the first input end and the second input end is converted into a differential current signal to be detected output from the first output end and the second output end.

The second signal conversion module sends the current signal to be detected to the comparison module through the first output end. The second output end may be hung in the air or be connected in other suitable manners. When the comparison module outputs a low-level voltage, it indicates that magnitude of the differential voltage signal to be detected (VIP-VIN) is greater than the threshold of the signal detection circuit. When the comparison module outputs a high-level voltage, it indicates that the magnitude of the differential voltage signal to be detected (VIP-VIN) is smaller than the threshold of the signal detection circuit.

Optionally, the circuit further includes a reference signal generation module RE1. For specific implementation of the module, reference may be made to FIG. 7 in the following.

The reference signal generation module RE1 is configured to generate a differential reference voltage signal (VREFP at a positive terminal and VRERN at a negative terminal) in direct proportion to a band-gap reference voltage signal VBG, and send the VREFP and VRERN to the first input end and the second input end of the first signal conversion module G1 respectively.

Optionally, the circuit further includes an isolation and filtration module A1. For specific implementation of the module A1, reference may be made to FIG. 8 in the following.

The isolation and filtration module A1 is configured to isolate and filter voltage signals to be detected RX+ and RX−, and send the isolated and filtered voltage signals to be detected VIP and VIN to a first input end and a second input end of the second signal conversion module G2 respectively.

Optionally, the circuit further includes an inverter INV0.

The inverter INV0 is configured to be connected with the output end of the third inverter, where the output end of the third inverter outputs the comparison result VON.

Optionally, the circuit further includes a digital buffer module D1.

An input end of the digital buffer module D1 is connected with an output end of the inverter INV0, and is configured to enhance output driving capability of the INV0 and output an energy indication signal ENERGY DETECT.

Figure 4:
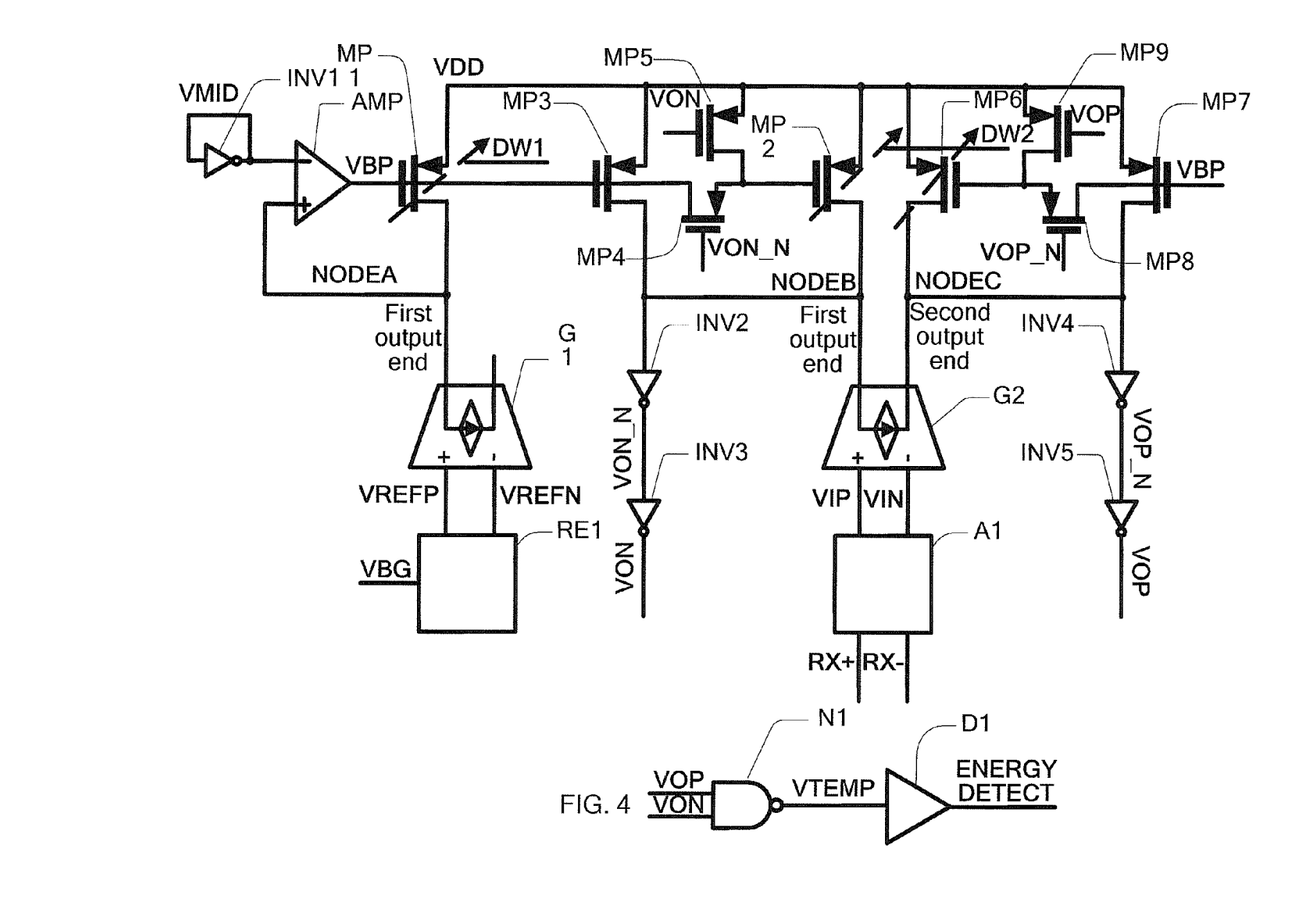
FIG. 4 is a diagram of a signal detection circuit with a fully symmetric differential structure according to an embodiment of the present invention.

Based on the preceding embodiment, as shown in FIG. 4, a signal detection circuit with a fully differential structure is provided in an embodiment of the present invention. The circuit includes a signal conversion module, a threshold control module, a hysteresis generation module, a replicated hysteresis generation module, a comparison module, and a replicated comparison module. It may be understood that, in comparison with FIG. 3, in the signal detection circuit with the fully differential structure, a seventh MOS FET MP7 that is identical to a third MOS FET MP3 is added in the threshold control module, and the replicated hysteresis generation module identical to the hysteresis generation module and the replicated comparison module identical to the comparison module are further provided. The details are as follows:

The signal conversion module includes a first signal conversion module G1 and a second signal conversion module G2.

The threshold control module includes: a first inverter INV1, an operational amplifier AMP, a first MOS FET MP1, the third MOS FET MP3, and the seventh MOS FET MP7. The first MOS FET MP1 is a programmable MOS FET, and for a specific circuit structure, reference may be made to FIG. 6.

The comparison module includes a second inverter INV2 and a third inverter INV3.

The replicated comparison module includes a fourth inverter INV4 and a fifth inverter INV5.

The hysteresis generation module includes a second MOS FET MP2, a fourth MOS FET MP4, and a fifth MOS FET MP5.

The replicated hysteresis generation module includes a sixth MOS FET MP6, an eighth MOS FET MP8, and a ninth MOS FET MP9.

Figure 6:
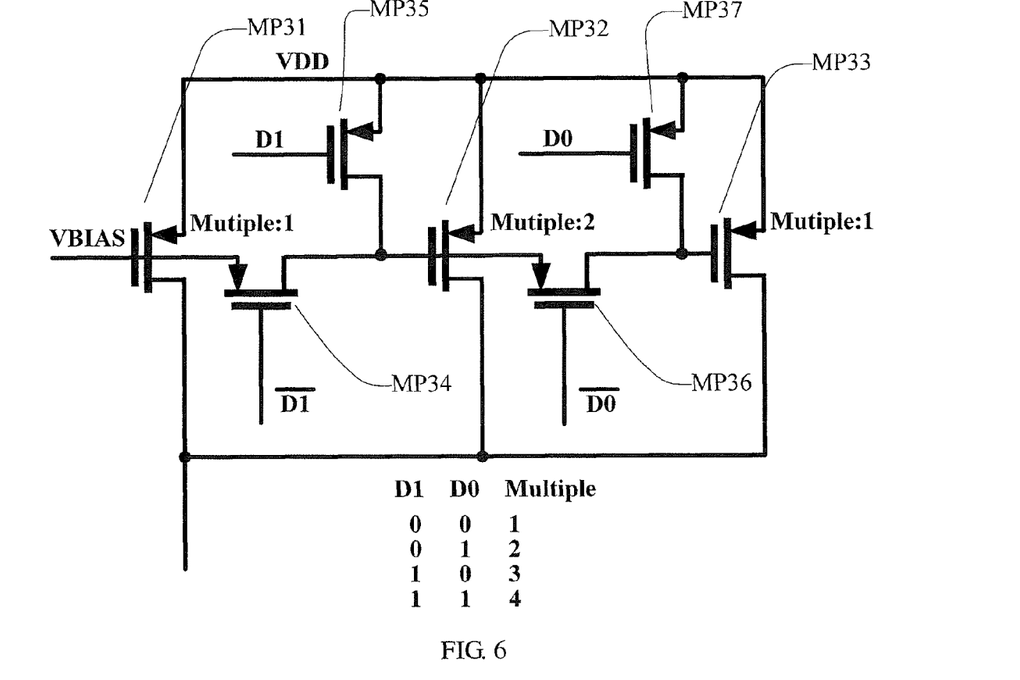
FIG. 6 is a circuit diagram of a programmable MOS FET in a signal detection circuit according to an embodiment of the present invention.

The second MOS FET MP2 and the sixth MOS FET MP6 are programmable MOS FETs, and for specific circuit structures, reference may be made to FIG. 6.

The G1 of the signal conversion module is configured to convert a reference voltage signal into a reference current signal, and send the converted reference current signal to the threshold control module. The second signal conversion module G2 is configured to convert a voltage signal to be detected into a current signal to be detected, and send the current signal to be detected to the comparison module and the replicated comparison module through a first output end and a second output end of the G2 respectively.

Here, the first signal conversion module G1 and the second signal conversion module G2 have the same voltage-current conversion gain, and for specific implementation, reference may be made to FIG. 5 in the following.

An output end of the first inverter INV1 is connected with an input end of the first inverter INV1, and the output end of the first inverter INV1 is connected with a negative phase input end of the operational amplifier AMP.

A positive phase input end of the operational amplifier AMP is connected with a drain electrode of the first MOS FET MP1 and a first output end of the first signal conversion module G1.

An output end of the operational amplifier AMP is connected with a grid electrode of the first MOS FET MP1, a grid electrode of the third MOS FET MP3, and a grid electrode of the seventh MOS FET MP7.

A source electrode of the first MOS FET MP1, a source electrode of the third MOS FET MP3, and a source electrode of the seventh MOS FET MP7 are connected with a power source VDD.

A drain electrode of the third MOS FET MP3 is connected with an input end of the second inverter INV2 and the first output end of the second signal conversion module G2.

A drain electrode of the seventh MOS FET MP7 is connected with an input end of the fourth inverter INV4 and the second output end of the second signal conversion module G2.

An output end of the second inverter INV2 is connected with an input end of the third inverter INV3.

An output end of the third inverter INV3 outputs a first comparison result VON of the fully differential structure; and the output end of the third inverter INV3 feeds back the first comparison result VON to a grid electrode of the fifth MOS FET MP5 of the hysteresis generation module. The output end of the second inverter INV2 outputs a signal VON_N and feeds back the signal VON_N to a grid electrode of the fourth MOS FET MP4 of the hysteresis generation module.

An output end of the fourth inverter INV4 is connected with an input end of the fifth inverter INV5.

An output end of the fifth inverter INV5 outputs a second comparison result VOP of the fully differential structure; and the output end of the fifth inverter INV5 feeds back the second comparison result VOP to a grid electrode of the ninth MOS FET MP9 of the hysteresis generation module. The output end of the fourth inverter INV4 outputs a signal VOP_N, and feeds back the signal VOP_N to a grid electrode of the eighth MOS FET MP8 of the hysteresis generation module.

A source electrode of the second MOS FET MP2, a source electrode of the fifth MOS FET MP5, a source electrode of the sixth MOS FET MP6, and a source electrode of the ninth MOS FET MP9 are connected with the power source VDD.

A grid electrode of the second MOS FET MP2 is connected with a source electrode of the fourth MOS FET MP4 and a drain electrode of the fifth MOS FET MP5.

A grid electrode of the sixth MOS FET MP6 is connected with a source electrode of the eighth MOS FET MP8 and a drain electrode of the ninth MOS FET MP9.

A drain electrode of the second MOS FET MP2 is connected with the first output end of the second signal conversion module G2, the input end of the second inverter INV2, and the drain electrode of the third MOS FET MP3 respectively.

A drain electrode of the sixth MOS FET MP6 is connected with the second output end of the second signal conversion module G2, an input end of the fourth inverter INV4, and the drain electrode of the seventh MOS FET MP7 respectively.

The grid electrode of the fifth MOS FET MP5 is connected with the output end of the third inverter INV3.

The grid electrode of the ninth MOS FET MP9 is connected with the output end of the fifth inverter INV5.

The grid electrode of the fourth MOS FET MP4 is connected with the output of the second inverter INV2.

The grid electrode of the eighth MOS FET MP8 is connected with the output end of the fourth inverter INV4.

A drain electrode of the fourth MOS FET MP4 is connected with the grid electrode of the third MOS FET MP3.

A drain electrode of the eighth MOS FET MP8 is connected with the grid electrode of the seventh MOS FET MP7.

Here, the threshold control module changes magnitude of a threshold current signal according to a threshold control signal to determine a threshold of the signal detection circuit. The second signal conversion module has a first input end, a second input end, a first output end, and a second output end. When a voltage of the first input end is greater than a voltage of the second input end (that is, VIP is greater than VIN), the current signal to be detected flows into the second signal conversion module from the first output end (NODEB) and flows out of the second signal conversion module from the second output end (NODEC). When the voltage of the first input end is smaller than the voltage of the second input end (that is, VIP is smaller than VIN), the current signal to be detected flows out of the second signal conversion module from the first output end (NODEB) and flows into the second signal conversion module from the second output end (NODEC). A differential voltage signal to be detected input from the first input end and the second input end is converted into a differential current signal to be detected output from the first output end and the second output end.

It may be understood that, here, the threshold control module is configured to generate a replicated threshold current signal that is equal to the threshold current signal, and send the replicated threshold current signal to the replicated comparison module.

The second signal conversion module outputs the differential current signal to be detected to the comparison module and the replicated comparison module through the first output end (it may also be understood as NODEB) and the second output end (it may also be understood as NODEC) respectively.

The replicated hysteresis generation module is configured to: generate a replicated hysteresis current signal that is equal to a hysteresis current signal, receive a comparison result output by the replicated comparison module; and according to the comparison result output by the replicated comparison module, determine whether to superimpose the replicated hysteresis current signal onto the replicated threshold current signal.

The replicated comparison module is configured to: when the current signal to be detected flowing out of an input end of the replicated comparison module has greater magnitude than the replicated threshold current signal flowing into the input end of the replicated comparison module, output a low-level voltage; when the current signal to be detected flowing out of the input end of the replicated comparison module has smaller magnitude than the replicated threshold current signal flowing into the input end of the replicated comparison module, output a high-level voltage; and when both the current signal to be detected and the replicated threshold current flow into the input end of the replicated comparison module, output a high-level voltage.

When either the comparison module or the replicated comparison module outputs a low-level voltage, it indicates that an absolute value of the differential voltage signal to be detected is greater than the threshold of the signal detection circuit. It may be understood that, if the comparison module outputs a low-level voltage, it indicates that a voltage value obtained by subtracting a voltage at the second input end from a voltage at the first input end of the second signal conversion module is greater than the threshold of the signal detection circuit. If the replicated comparison module outputs a low-level voltage, it indicates that a voltage value obtained by subtracting a voltage at the first input end from a voltage at the second input end of the second signal conversion module is greater than the threshold of the signal detection circuit.

It may be understood that, in this embodiment of the present invention, if the gains of the G1 module and the G2 module are different, the gains of the G1 module and the G2 module may be adjusted to adjust the threshold of the signal detection circuit, or the threshold of the signal detection circuit may be adjusted by adjusting the reference voltage signal. In this embodiment of the present invention, the threshold current signal may be understood as a current flowing through MP3 or a superimposed current of currents flowing through the MP3 and MP2.

It may be understood that, the circuit further includes a reference signal generation module RE1. For specific implementation of the module, reference may be made to FIG. 7 in the following.

In this embodiment of the present invention, all the MOS FETs are PMOS FETs, and all the MOS FETs may also be implemented through NMOS FETs in the same manner. Persons skilled in the art may easily replace all or a part of the circuits in this embodiment of the present invention according to the disclosure of this embodiment of the present invention. For example, the MOS FET may be replaced with other kinds of transistors, or the signal conversion module, the threshold control module, the comparison module, or the hysteresis generation module may be replaced with other similar circuits having the same functions.

The reference signal generation module RE1 is configured to generate a differential reference voltage signal (VREFP at a positive terminal and VRERN at a negative terminal) in direct proportion to a band-gap reference voltage signal VBG, and send the VREFP and VRERN to the first input end and the second input end of the first signal conversion module G1 respectively. It should be noted that, the circuit further includes an isolation and filtration module A1. For specific implementation of the module A1, reference may be made to FIG. 8 in the following.

The isolation and filtration module A1 is configured to isolate and filter voltage signals to be detected RX+ and RX−, and send the isolated and filtered voltage signals to be detected VIP and VIN to a first input end and a second input end of the second signal conversion module G2 respectively.

It should also be noted that, the circuit further includes a NOT-AND gate with two input ends N1.

The two input ends of the NOT-AND gate are respectively configured to be connected with the output end of the third inverter and the output end of the fifth inverter in the circuit with the fully differential structure. The output end of the third inverter outputs the comparison result VON; and the output end of the fifth inverter outputs the comparison result VOP.

It should also be noted that, the circuit further includes a digital buffer module D1.

An input end of the digital buffer module D1 is connected with an output end of the NOT-AND gate N1, and is configured to enhance output driving capability of the NOT-AND gate and output an energy indication signal ENERGY DETECT.

Based on the preceding signal detection circuit, the present invention is described in detail through a working principle of the signal detection circuit in the following. The reference signal generation module RE1 generates a reference voltage VREF in direct proportion to a band-gap reference voltage VBG; that is, VREF=VREFP−VREFN=K*VBG, where K is a scaling factor. The VREF is not influenced by Process, Voltage, and Temperature (hereinafter referred to as PVT). The VREF drives a G1 circuit to generate a current with the magnitude of VRE*$G_m$ flowing through a PMOS FET MP1, where Gm is a gain of the G1 circuit. MP1 is a programmable MOS FET circuit. Multiple (the number of MOS FETs connected in parallel) of the MP1 is L, and L may be controlled by a digital signal DW1 in a programming manner. The MP1 is biased by a voltage VBP. A turnover point of the first inverter INV1 is VMID, which is obtained by short circuiting the input and the output of the INV1. The VMID is generally designed as a half of a voltage of the power source VDD. A voltage that enables the AMP to drive NODEA is equal to the VMID. The PMOS FETs MP3 and MP7 are also biased by VBP, and the Multiple of the PMOS FETs MP3 and MP7 both are M. The PMOS FETs MP2 and MP6 are programmable MOS FET circuits. Voltages at the grid electrodes of the PMOS FETs MP2 and MP6 are controlled by VON and VOP respectively. The Multiple of the PMOS FETs MP2 and MP6 both are N, and N may be controlled by a digital signal DW2 in a programming manner. The MP4, MP5, MP8, and MP9 are switching FETs. The MP4, MP5, MP8, and MP9 are turned on when voltages at the grid electrodes of the MP4, MP5, MP8, and MP9 are low-level, and turned off when voltages at the grid electrodes of the MP4, MP5, MP8, and MP9 are high-level. Therefore, when the VON is high-level and the VON_N is low-level, the MP5 is not turned on, the MP4 is turned on, and the voltage at the grid electrode of the MP2 equals to the VBP; and when the VON is low-level and the VON_N is high-level, the MP5 is turned on, the MP4 is not turned on, the voltage at the grid electrode of the MP2 equals to the VDD, and the MP2 is not turned on. When the VOP is high-level and the VOP_N is low-level, the MP9 is not turned on, the MP8 is turned on, and the voltage at the grid electrode of the MP6 equals to the VBP; and when the VOP is low-level and the VOP_N is high-level, the MP9 is turned on, the MP8 is not turned on, the voltage at the grid electrode of the MP6 equals to the VDD, and the MP6 is not turned on. The currents from the MP2 and MP3 both flow into a node NODEB, and the currents from the MP6 and MP7 both flow into a node NODEC, in this way, superimposition of the hysteresis current signal and the threshold current signal is implemented. The differential signal RX+ and RX− is input to the A1 module for isolation and filtration. The VIP and VIN signals output by the A1 module are input to the first input end and the second input end of the G2 module respectively. Voltage-current conversion gains of a G2 circuit and the G1 circuit are the same. The first input end and the second input end of the G2 are connected with the NODEB and the NODEC respectively. Voltages at the NODEB and the NODEC drive the inverters INV2 and INV4 respectively. Output signals VON_N and VOP_N of the INV2 and the INV4 drive the inverters INV3 and INV5 respectively. VTEMP is obtained by performing a NOT-AND logic operation on output signals VON and VOP of the INV3 and the INV5, and then passes through the D1 module to output the energy indication signal ENERGY DETECT. The D1 module is configured to drive a load of the signal detection circuit. In FIG. 4, the INV2, INV3, INV4, and INV5 are the same as the INV1 completely. The MP1 to MP9 in FIG. 4 are all PMOS FETs. The signal detection circuit in FIG. 4 may also be implemented by using NMOS FETs in the same manner.

It is assumed that VIP is greater than or equal to VIN, and when VIP−VIN=0, a output current of the G2 circuit is 0, the voltages at the NODEB and the NODEC are both pulled up, both VON_N and VOP_N are low-level, both VON and VOP are high-level, both the MP2 and MP6 are turned on, and both the VTEMP and the energy indication signal ENERGY DETECT are low-level.

When VIP−VIN is increased from 0 to VTRIP+ (a threshold of the signal detection circuit generated when an input signal of the signal detection circuit is changed from a low level to a high level), and $G_m$*VTRIP+=VREF*$G_m$*(M+N)/L, that is, VTRIP+=VREF*(M+N)/L=VBG*K*(M+N)/L, is satisfied, the voltage at the NODEB is decreased to the voltage at the NODEA, that is, VMID; the inverter INV2 is turned over; the VON_N is changed from a low level to a high level; the VON is changed from a high level to a low level; and the energy indication signal ENERGY DETECT is changed from a low level to a high level. At this time, the MP2 is turned off, the voltage at the NODEC is still high-level, the VOP_N is still low-level, the VOP is still high-level, and the MP6 is still turned on. When VIP−VIN is decreased from a greater value (greater than VTRIP+) to VTRIP− (a threshold of the signal detection circuit generated when the input signal of the signal detection circuit is changed from a high level to a low level), and $G_m$*VTRIP−=VREF*$G_m$*M/L, that is, VTRIP−=VREF*M/L=VBG*K*M/L, is satisfied, the voltage at the NODEB is increased to the VMID; the inverter INV2 is turned over; the VON_N is changed from a high level to a low level; the VON is changed from a low level to a high level; and the VOP is still high-level, so that the energy indication signal ENERGY DETECT is changed from a high level to a low level. At this time, the MP2 is turned on again.

A signal passage is a fully symmetric differential structure, so that a situation where the VIP is smaller than the VIN is similar to a situation where the VIP is greater than the VIN, except that the voltage at the NODEB is always high-level and the voltage at the NODEC varies with a variation of VIN−VIP.

To sum up, when |VIP−VIN|>VTRIP+, the energy indication signal ENERGY DETECT is high-level; when |VIP−VIN|<VTRIP−, the energy indication signal ENERGY DETECT is low-level; hysteresis magnitude is (VTRIP+)−(VTRIP−)=VBG*K*N/L; and relative hysteresis magnitude is ((VTRIP+)−(VTRIP−))/((VTRIP+)+(VTRIP−))=N/(2M+N). Therefore, the magnitude of the threshold and the hysteresis of the signal detection circuit both are in direct proportion to the band-gap reference voltage VBG and are not influenced by the PVT. Both of the magnitude of the threshold and the relative magnitude of the hysteresis may be controlled in a programming manner separately. The threshold may be controlled by programming L, and the relative magnitude of the hysteresis may be controlled by programming N. The programming L and the programming N are not influenced by each other. In addition, the PHY may also distinguish a 10

Mbps signal from a 100 Mbps signal through an impulse density of the energy indication signal ENERGY DETECT.

During designing, it should be ensured that the signal detection circuit has an enough rapid speed of response to the 10 Mbps signal and the 100 Mbps signal.

If only magnitude of (RX+)−(RX−) rather than an absolute value of (RX+)−(RX−) needs to be determined, the MP6, MP7, MP8, MP9, INV4, and INV5 in FIG. 4 may be deleted, and at the same time, the NOT-AND gate N1 needs to be replaced with an inverter, at this time, an input end of the inverter is VON, and an output end of the inverter is connected with an input end of the D1 module.

If only magnitude of (RX−)−(RX+) rather than an absolute value of (RX−)−(RX+) needs to be determined, the MP2, MP3, MP4, MP5, INV2, and INV3 in FIG. 4 may be deleted, and at the same time, the NOT-AND gate N1 needs to be replaced with an inverter, at this time, an input end of the inverter is VOP, and an output end of the inverter is connected with the input end of the D1 module.

It should be noted that, the D1 module may be selected to use according to a load situation of the signal detection circuit.

It may be understood that, when the voltage signals to be detected RX+ and RX− do not need to be isolated and filtered, the isolation and filtration module A1 may be deleted, and the voltage signals to be detected RX+ and RX− are directly sent to the first input end and the second input end of the second signal conversion module G2 respectively.

Figure 5:
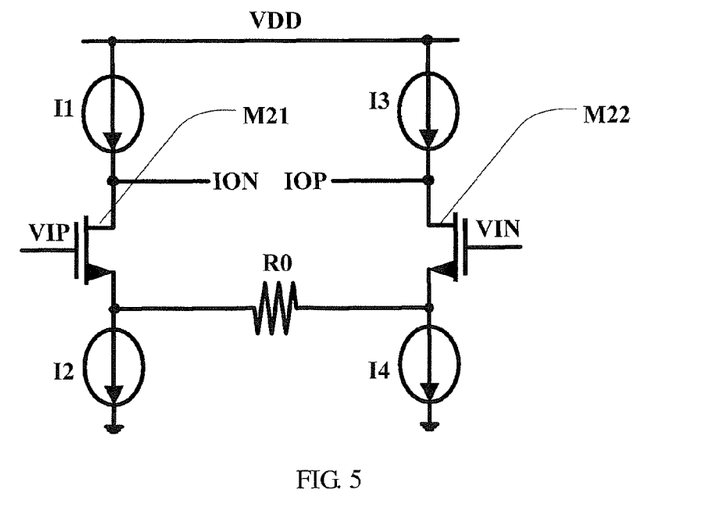
FIG. 5 is a circuit diagram of specific implementation of a signal conversion module in a signal detection circuit according to an embodiment of the present invention.

FIG. 5 is a circuit diagram of specific implementation of a signal conversion module in a signal detection circuit according to an embodiment of the present invention.

The signal conversion module includes an MOS FET M21, an MOS FET M22, a resistor R0, and four current sources, where the M21 and M22 are a differential pair, a bias current is I, and R0 is a resistor for linearizing a gain of the signal conversion module. If a value of R0 is great enough, the gain of the signal conversion module is approximately 1/R0.

A grid electrode of the MOS FET M21 is configured to receive an isolated and filtered voltage signal to be detected VIP. A drain electrode of the MOS FET M21 is connected with a negative terminal of a first current source I1. A source electrode of the MOS FET M21 is connected with a positive terminal of a second current source I2 and one end of the resistor R0 respectively. The drain electrode of the MOS FET M21 is further configured to be connected with a first output end ION of the signal conversion module.

A positive terminal of the first current source I1 is connected with a power source VDD, and a negative terminal of the second current source I2 is grounded.

A grid electrode of the MOS FET M22 is configured to receive an isolated and filtered voltage signal to be detected VIN. A drain electrode of the MOS FET M22 is connected with a negative terminal of a third current source I3. A source electrode of the MOS FET M22 is connected with a positive terminal of a fourth current source I4 and the other end of the resistor R0 respectively. The drain electrode of the MOS FET M22 is further configured to be connected with a second output end IOP of the signal conversion module.

A positive terminal of the third current source I3 is connected with the power source VDD, and a negative terminal of the fourth current source I4 is grounded.

It may be understood that, FIG. 5 only shows one implementing manner of the signal conversion module. The present invention does not limit specific implementation of the signal conversion module.

FIG. 6 is a circuit diagram of a programmable MOS NET in a signal detection circuit according to an embodiment of the present invention.

The programmable MOS FET circuit includes MP31, MP32, MP33, MP34, MP35, MP36, and MP37, where Multiple of an equivalent MOS FET formed by combining the MP31, MP32, and MP33 may be controlled by programming a two-bit digital signal. The two-bit digital signal controls four switching FETs MP34, MP35, MP36, and MP37. The Multiple of the equivalent MOS FET formed by combining the MP31, MP32, and MP33 may be controlled by programming a two-bit digital signal to be four values, namely, 1, 2, 3, and 4. For example, if inputs of D1 and D0 are 0 and 0, the Multiple is 1; if the inputs of the D1 and D0 are 0 and 1, the Multiple is 2; if the inputs of the D1 and D0 are 1 and 0, the Multiple is 3; and if the inputs of the D1 and D0 are 1 and 1, the Multiple is 4.

It may be understood that, FIG. 6 only shows one implementing manner of the programmable MOS NET circuit. The present invention does not limit specific implementation of the programmable MOS FET circuit.

Figure 7:
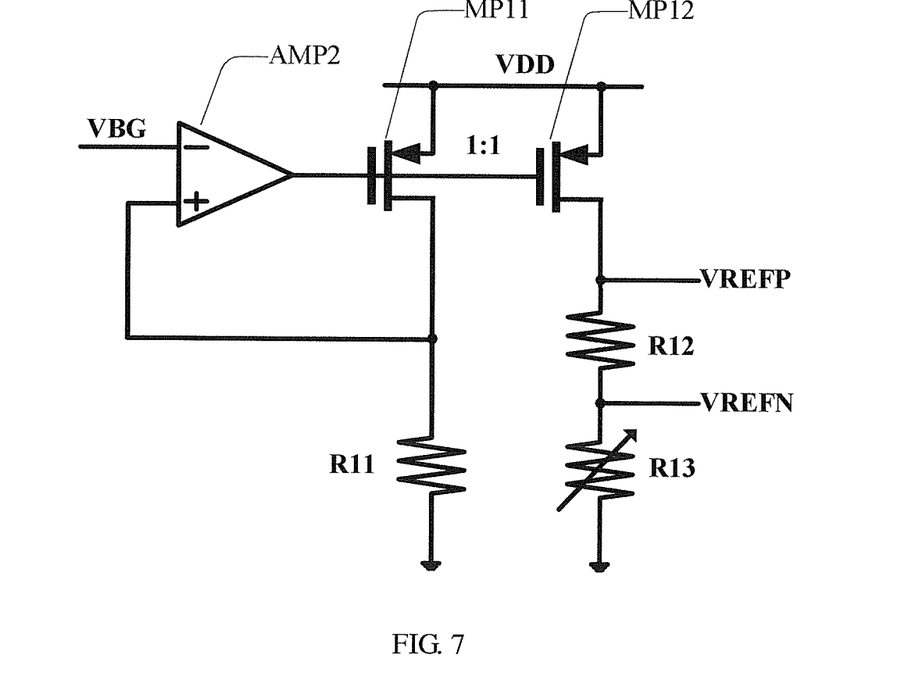
FIG. 7 is a circuit diagram of specific implementation of a reference signal generation module in a signal detection circuit according to an embodiment of the present invention.

FIG. 7 is a circuit diagram of specific implementation of a reference signal generation module RE1 in a signal detection circuit according to an embodiment of the present invention.

The reference signal generation module RE1 includes an MOS NET MP11, an MOS NET MP12, an operational amplifier AMP2, a resistor R11, a resistor R12, and a resistor R13.

A negative phrase input end of the operational amplifier AMP2 receives a band-gap reference voltage signal VBG, and a positive input end of the operational amplifier AMP2 is connected with a drain electrode of the MP11 and one end of the resistor R11 respectively.

An output end of the operational amplifier AMP2 is connected with grid electrodes of the MP11 and MP12.

Source electrodes of the MP11 and MP12 are connected with a power source VDD.

The other end of the resistor R11 is grounded.

A drain electrode of MP12 is connected with one end of the resistor R12. The other end of the resistor R12 is connected with one end of the resistor R13. Voltage signals at two ends of the R12 are VRERP and VRERN respectively.

The other end of the resistor R13 is grounded.

The R11, R12, and R13 are the same type of resistors on a chip, for example, poly-silicon (POLY) resistors. The MP11 and MP12 form a current mirror. The AMP2 is an amplifier. The equation VREFP−VREFN=VBG*R12/R11 exists, where a ratio R12/R11 may be regarded as a constant. The R13 in FIG. 7 is an adjustable resistor, and is configured to adjust a common-mode level of the VREFP and VREFN to be equal to a common-mode level of inputs VIP and VIN of the signal detection circuit.

It may be understood that, FIG. 7 only shows one implementing manner of the reference signal generation module RE1. The present invention does not limit specific implementation of the reference signal generation module RE1.

Figure 8:
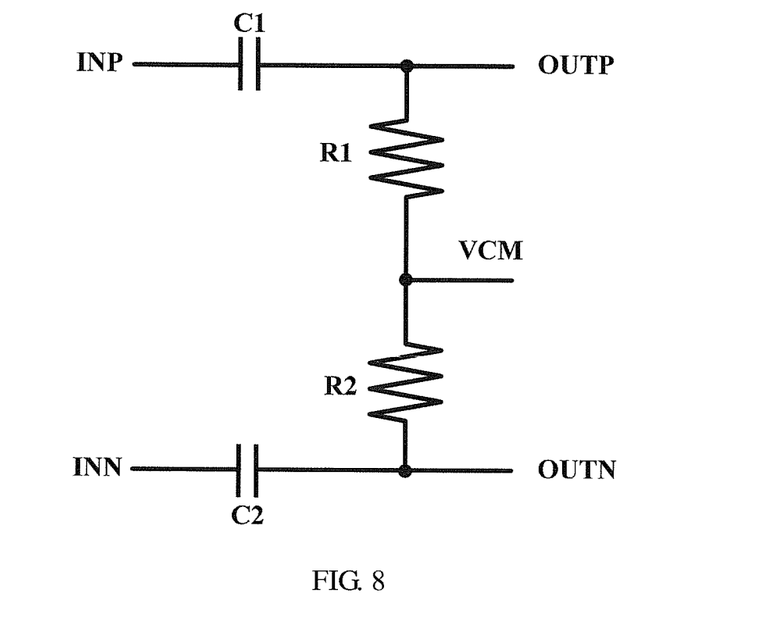
FIG. 8 is a circuit diagram of specific implementation of an isolation and filtration module in a signal detection circuit according to an embodiment of the present invention.

FIG. 8 is a circuit diagram of specific implementation of an isolation and filtration module in a signal detection circuit according to an embodiment of the present invention.

The isolation and filtration module includes a capacitor C1, a capacitor C2, a resistor R1, and a resistor R2. Input ends INP and INN are alternating-current (AC)-coupled to output ends OUTP and OUTN through the capacitors C1 and C2. The capacitors C1 and C2 and the resistors R1 and R2 form a high-pass filter, and a bandwidth of the filter satisfies a speed requirement of an Ethernet signal. The capacitors C1 and C2 have the same capacitance value, for example, the capacitance value may be 5 pF. The resistors R1 and R2 have the same resistance value, for example, the resistance value may be 30K ohms. VCM is used to set a common-mode level of the OUTP and OUTN.

It may be understood that, FIG. 8 only shows one implementing manner of the isolation and filtration module. The present invention does not limit specific implementation of the isolation and filtration module.

Figure 9:
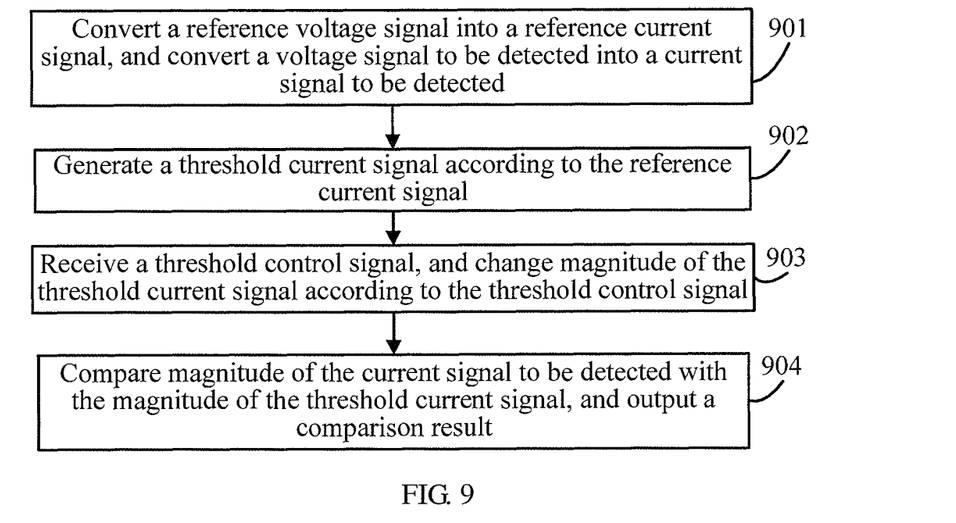
FIG. 9 is a flow chart of a signal detection method according to an embodiment of the present invention.

Referring to FIG. 9, an embodiment of the present invention further provides a signal detection method.

The method includes the following steps.

Block 901: Convert a reference voltage signal into a reference current signal, and convert a voltage signal to be detected into a current signal to be detected.

Block 902: Generate a threshold current signal according to the reference current signal.

Block 903: Receive a threshold control signal, and change magnitude of the threshold current signal according to the threshold control signal.

Block 904: Compare magnitude of the current signal to be detected with the magnitude of the threshold current signal, and output a comparison result.

Optionally, here, the threshold control signal is a digital threshold control signal, and step 903 specifically includes: generating, according to the reference current signal, a threshold current signal having a first proportional relation with the reference current signal; and receiving a digital threshold control signal that is input according to detection requirements, and adjusting the first proportional relation according to the digital threshold control signal, so as to change the magnitude of the threshold current signal.

Figure 10:
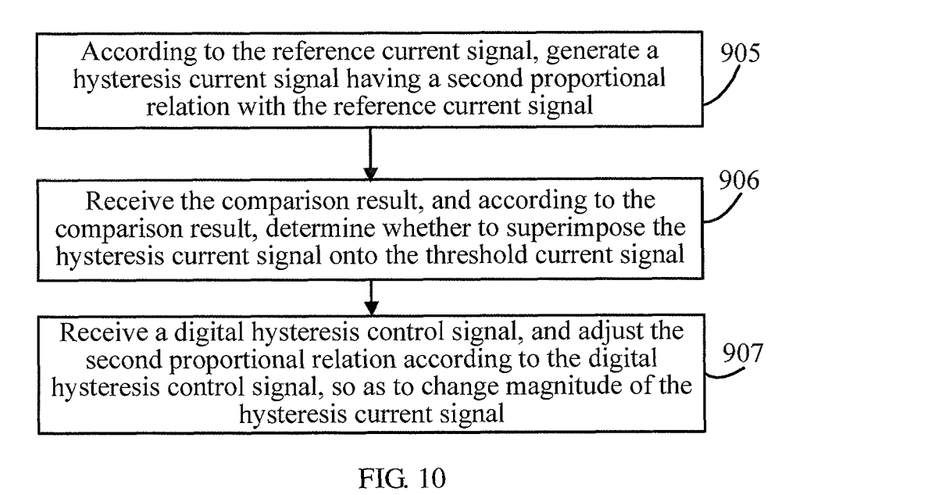
FIG. 10 is a flow chart of another signal detection method according to an embodiment of the present invention.

Optionally, referring to FIG. 10, the signal detection method in this embodiment further includes:

Block 905: Generate, according to the reference current signal, a hysteresis current signal having a second proportional relation with the reference current signal.

Block 906: Receive the comparison result, and according to the comparison result, determine whether to superimpose the hysteresis current signal onto the threshold current signal.

Block 907: Receive a digital hysteresis control signal, and adjust the second proportional relation between the hysteresis current signal and the reference current signal according to the digital hysteresis control signal, so as to change magnitude of the hysteresis current signal.

Optionally, the signal detection method in this embodiment further includes Block 906. In Block 906, a gain of converting the reference voltage signal into the reference current signal is the same as a gain of converting the voltage signal to be detected into the current signal to be detected.

Figure 11:
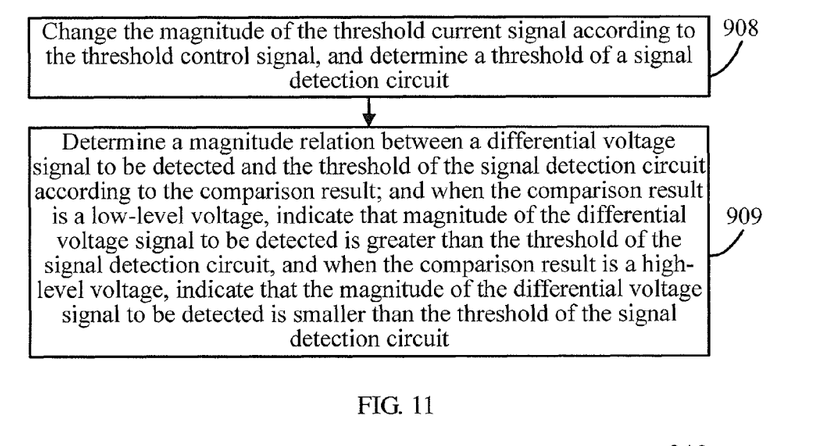
FIG. 11 is a flow chart of another signal detection method according to an embodiment of the present invention.

Optionally, referring to FIG. 11, the signal detection method in this embodiment further includes:

Block 908: Change the magnitude of the threshold current signal according to the threshold control signal, and determine a threshold of a signal detection circuit.

Block 909: Determine a magnitude relation between a differential voltage signal to be detected and the threshold of the signal detection circuit according to the comparison result; and when the comparison result is a low-level voltage, indicate that magnitude of the differential voltage signal to be detected is greater than the threshold of the signal detection circuit, and when the comparison result is a high-level voltage, indicate that the magnitude of the differential voltage signal to be detected is smaller than the threshold of the signal detection circuit.

Figure 12:
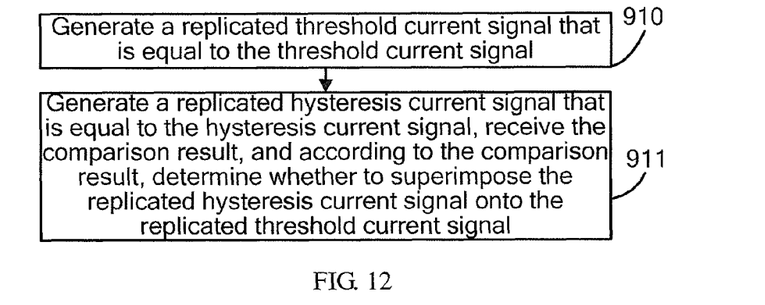
FIG. 12 is a flow chart of another signal detection method according to an embodiment of the present invention.

Optionally, referring to FIG. 12, the signal detection method in this embodiment further includes:

Block 910: Generate a replicated threshold current signal that is equal to the threshold current signal.

Block 911: Generate a replicated hysteresis current signal that is equal to the hysteresis current signal, receive the comparison result, and according to the comparison result, determine whether to superimpose the replicated hysteresis current signal onto the replicated threshold current signal.

Figure 13:
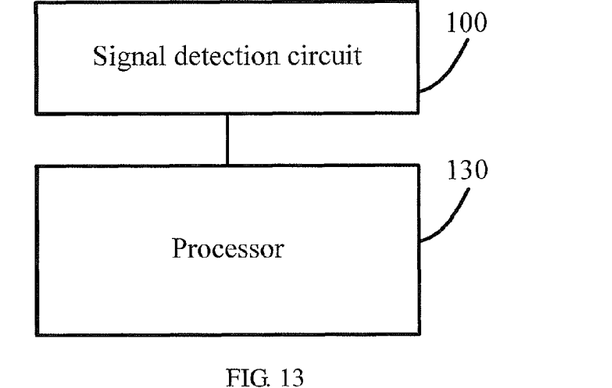
FIG. 13 is a schematic diagram of a signal detection system according to an embodiment of the present invention.

Referring to FIG. 13, a signal detection system according to an embodiment includes a signal detection circuit and a processing system. The system includes a signal detection circuit 100 and a processor 130. For the signal detection circuit 100, reference may be made to the preceding description in this specification of the present invention. The processor 130 is configured to perform an operation on a result received from the signal detection circuit 100, and execute operation such as signal energy detection, signal speed discrimination, signal polarity discrimination, and power consumption management.

With a circuit, a method, a system for signal detection provided in the embodiments of the present invention, a signal conversion module converts a reference voltage signal into a reference current signal, sends the reference current signal to a threshold control module, converts a voltage signal to be detected into a current signal to be detected, and sends the current signal to be detected to a comparison module; the threshold control module generates, according to the reference current signal, a threshold current signal having a first proportional relation with the reference current signal, sends the threshold current signal to the comparison module; receives a threshold control signal, and changes magnitude of the threshold current signal according to the threshold control signal; and the comparison module is configured to compare magnitude of the current signal to be detected with the magnitude of the threshold current signal, and output a comparison result. Therefore, a threshold of the signal detection circuit can be configured flexibly, so that detection flexibility of the signal detection circuit is increased. It may be understood by persons skilled in the art that, a low-level voltage and a high-level voltage in the present invention may be relative values and do not necessarily refer to a specific low voltage value or a specific high voltage value. The low-level voltage and the high-level voltage may be defined as a first-level voltage and a second-level voltage for distinguishing.

In the signal detection circuit or the signal detection method provided in the embodiments of the present invention, the signal detection circuit may be integrated into a PHY chip by using a Complementary Metal Oxide Semiconductor (CMOS) integrated circuit technology, therefore, the setting-up cost is reduced in comparison with the prior art. Optionally, a band-gap reference voltage signal is adopted to generate a reference voltage signal, so that influence of PVT on the reference voltage signal may be reduced, thus increasing detection accuracy. Optionally, a circuit with a fully differential structure is adopted so that absolute amplitude of a differential signal may be compared. Furthermore, a hysteresis characteristic is introduced so that noise immunity capability of the signal detection circuit may be improved, thus increasing detection reliability. In addition, programmable hysteresis magnitude further increases the detection flexibility.

It should be noted that, the signal detection circuit in the present invention may be applied to signal detection in various terminals and systems in not only wired communications but also optical communications and wireless communications, except that signal frequency and amplitude of a detection object are different from those in the present invention, therefore, the threshold setting and speed requirement of the signal detection circuit are also different from those in the present invention.

The preceding is only specific implementation of the present invention, but the protection scope of the present invention is not limited herein. Any change or replacement that can be easily figured out by persons skilled in the art within the technical scope disclosed by the present invention shall all fall within the protection scope of the present invention. Therefore, the protection scope of the present invention shall be subject to the protection scope defined by the claims.

What is claimed is:

1. A signal detection circuit, comprising:
    a signal conversion module, a threshold control module, and a comparison module, wherein:
    the signal conversion module is configured to: convert a reference voltage signal into a reference current signal, and send the reference current signal to the threshold control module; and convert a voltage signal to be detected into a current signal to be detected, and send the current signal to be detected to the comparison module;
    the threshold control module is configured to: generate a threshold current signal according the reference current signal, and send the threshold current signal to the comparison module; and receive a threshold control signal, and change magnitude of the threshold current signal according to the threshold control signal; and
    the comparison module is configured to compare magnitude of the current signal to be detected with the magnitude of the threshold current signal, and output a comparison result,
    wherein the threshold control signal is a digital threshold control signal;
    the threshold control module is configured to: generate, according to the reference current signal, a threshold current signal having a first proportional relation with the reference current signal; and receive a digital threshold control signal that is input according to detection requirements, and adjust the first proportional relation according to the digital threshold control signal, so as to change the magnitude of the threshold current signal, and
    the hysteresis generation module is configured to: generate, according to the reference current signal, a hysteresis current signal having a second proportional relation with the reference current signal; receive the comparison result output by the comparison module; selectively superimpose the hysteresis current signal onto the threshold current signal according to the comparison result; and receive a digital hysteresis control signal that is input according to the detection requirements, and adjust the second proportional relation according to the digital hysteresis control signal, so as to change magnitude of the hysteresis current signal.

2. The signal detection circuit according to claim 1, wherein the signal conversion module comprises a first signal conversion module and a second signal conversion module; the first signal conversion module is configured to convert the reference voltage signal into the reference current signal, and the second signal conversion module is configured to convert the voltage signal to be detected into the current signal to be detected; and the first signal conversion module and the second signal conversion module have the same voltage-current conversion gain.

3. The signal detection circuit according to claim 2, wherein:
    the second signal conversion module has a first input end, a second input end, a first output end, and a second output end; when a voltage of the first input end is greater than a voltage of the second input end, the current signal to be detected flows into the second signal conversion module from the first output end, and flows out of the second signal conversion module from the second output end; when the voltage of the first input end is smaller than the voltage of the second input end, the current signal to be detected flows out of the second signal conversion module from the first output end, and flows into the second signal conversion module from the second output end; and a differential voltage signal to be detected input from the first input end and the second input end is converted into a differential current signal to be detected output from the first output end and the second output end.

4. The signal detection circuit according to claim 1, wherein the signal conversion module comprises a first signal conversion module and a second signal conversion module; the first signal conversion module is configured to convert the reference voltage signal into the reference current signal, and the second signal conversion module is configured to convert the voltage signal to be detected into the current signal to be detected, the signal detection circuit further comprises a reference signal generation module; the reference signal generation module is configured to generate a differential reference voltage signal in direct proportion to a band-gap reference voltage signal, and send the generated differential reference voltage signal to the first signal conversion module as the reference voltage signal.

5. The signal detection circuit according to claim 4, wherein the circuit further comprises a digital buffer module;
    an input end of the digital buffer module is connected with an output end of the NOT-AND gate, and is configured to enhance output driving capability of the NOT-AND gate.

6. The signal detection circuit according to claim 1, wherein the signal conversion module comprises a first signal conversion module and a second signal conversion module; the first signal conversion module is configured to convert the reference voltage signal into the reference current signal, and the second signal conversion module is configured to convert the voltage signal to be detected into the current signal to be detected,
    the signal detection circuit further comprises an isolation and filtration module;
    the isolation and filtration module is configured to isolate and filter voltage signals to be detected, and send the isolated and filtered voltage signals to be detected to one of the input ends of the second signal conversion module.

7. A signal detection method, comprising the following steps:
    converting a reference voltage signal into a reference current signal, and converting a voltage signal to be detected into a current signal to be detected;
    generating a threshold current signal according to the reference current signal;
    receiving a threshold control signal, and changing magnitude of the threshold current signal according to the threshold control signal; and
    comparing magnitude of the current signal to be detected with the magnitude of the threshold current signal, and outputting a comparison result,
    wherein when the threshold control signal is a digital threshold control signal, the step of receiving the threshold control signal and changing the magnitude of the threshold current signal according to the threshold control signal specifically comprises:

receiving a digital threshold control signal that is input according to detection requirements, generating, according to the reference current signal, a threshold current signal having a first proportional relation with the reference current signal; and adjusting the first proportional relation between the threshold current signal and the reference current signal according to the digital threshold control signal, so as to change the magnitude of the threshold current signal, wherein the method further comprises:

generating, according to the reference current signal, a hysteresis current signal having a second proportional relation with the reference current signal; receiving the comparison result; according to the comparison result, determining whether to superimpose the hysteresis current signal onto the threshold current signal; and receiving a digital hysteresis control signal, and adjusting the second proportional relation according to the digital hysteresis control signal, so as to change magnitude of the hysteresis current signal.

8. The signal detection method according to claim 7, wherein the method further comprises:

a gain of converting the reference voltage signal into the reference current signal is the same as a gain of converting the voltage signal to be detected into the current signal to be detected.

\* \* \* \* \*